(12) United States Patent
Liu et al.

(10) Patent No.: US 10,247,989 B2
(45) Date of Patent: Apr. 2, 2019

(54) TFT ARRAY SUBSTRATE, LIQUID CRYSTAL DISPLAY PANEL AND LIQUID CRYSTAL DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Zhipeng Liu, Shanghai (CN); Xianxiang Zhang, Shanghai (CN); Shaofa Lan, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 15/833,749

(22) Filed: Dec. 6, 2017

(65) Prior Publication Data

US 2018/0095332 A1    Apr. 5, 2018

Related U.S. Application Data

(62) Division of application No. 14/965,832, filed on Dec. 10, 2015, now Pat. No. 9,864,238.

(30) Foreign Application Priority Data

Dec. 30, 2014 (CN) .......................... 2014 1 0857072

(51) Int. Cl.
*G02F 1/1343* (2006.01)
*G02F 1/1337* (2006.01)
(Continued)

(52) U.S. Cl.
CPC ..... *G02F 1/134309* (2013.01); *G02B 6/0068* (2013.01); *G02F 1/133707* (2013.01);
(Continued)

(58) Field of Classification Search
CPC ......... G02F 1/133707; G02F 1/134309; G02F 1/134363; G02F 2001/134372
See application file for complete search history.

(56) References Cited

U.S. PATENT DOCUMENTS

| 7,589,813 B2 | 9/2009 | Chen et al. |
| 9,007,555 B2 | 4/2015 | Chang et al. |

(Continued)

FOREIGN PATENT DOCUMENTS

| CN | 101135824 A | 3/2008 |
| CN | 101750805 A | 6/2010 |

(Continued)

*Primary Examiner* — Jia Pan
(74) *Attorney, Agent, or Firm* — Faegre Baker Daniels LLP (57) ABSTRACT

A TFT array substrate, a liquid crystal display panel and a liquid crystal display device. The TFT array substrate includes: a plurality of pixel units; where each of the pixel units includes a first electrode comprising a V-shaped electrode with an angle; the plurality of pixel units include a first pixel unit and a second pixel unit, and where, the first pixel unit is closer to an edge of the TFT array substrate than the second pixel unit, and an angle of the V-shaped electrode in the first pixel unit is smaller than an angle of the V-shaped electrode in the second pixel unit.

10 Claims, 10 Drawing Sheets

(51) Int. Cl.
*F21V 8/00* (2006.01)
*H01L 27/12* (2006.01)

(52) U.S. Cl.
CPC ...... *G02F 1/134363* (2013.01); *H01L 27/124* (2013.01); *G02B 6/0061* (2013.01); *G02F 2001/134372* (2013.01)

(56) References Cited

U.S. PATENT DOCUMENTS

| | | | |
|---|---|---|---|
| 9,128,334 B1* | 9/2015 | Chen | G02F 1/133528 |
| 2005/0099573 A1* | 5/2005 | Kubo | G02F 1/134309 |
| | | | 349/146 |
| 2009/0310073 A1 | 12/2009 | Jeong et al. | |
| 2015/0062496 A1* | 3/2015 | Kang | G02F 1/133528 |
| | | | 349/96 |
| 2017/0212390 A1* | 7/2017 | Miyake | C08G 73/10 |

FOREIGN PATENT DOCUMENTS

| | | |
|---|---|---|
| CN | 102778795 A | 11/2012 |
| CN | 103645590 A | 3/2014 |
| KR | 1020080002631 A | 1/2008 |
| KR | 1020120078194 A | 7/2012 |
| TW | 200622419 A | 7/2006 |

* cited by examiner

TFT ARRAY SUBSTRATE, LIQUID CRYSTAL DISPLAY PANEL AND LIQUID CRYSTAL DISPLAY DEVICE

CROSS-REFERENCE TO RELATED APPLICATION

This application is a division of U.S. application Ser. No. 14/965,832, filed Dec. 10, 2015, which claims priority to Chinese Application No. 201410857072.8, filed Dec. 30, 2014, which is herein incorporated by reference in its entirety.

TECHNICAL FIELD

The present disclosure relates to the field of display technologies and, in particular, to a Thin-Film Transistor (TFT) array substrate, a liquid crystal display panel and a liquid crystal display device.

BACKGROUND

Liquid Crystal Display (LCD) panels have been widely applied to electronic products, such as monitors, laptop computers, digital cameras and video cameras. In manufacturing LCD panels by manufacturers, a TFT array substrate is produced and then combined with a color filter substrate, after that, liquid crystals are injected between the combined TFT array substrate and color filter substrate, and then the TFT array substrate and the color filter substrate are combined with components such as a backlight module, a driving Integrated Circuit (IC) and a control circuit board to obtain an LCD panel, which is in turn sold to downstream manufacturers for laptop computers, cellphones or LCD monitors.

SUMMARY

The present disclosure provides a TFT array substrate, including: a plurality of pixel units; wherein each of the pixel units includes a first electrode including a V-shaped electrode with an angle; the plurality of pixel units includes a first pixel unit and a second pixel unit, and wherein, the first pixel unit is closer to an edge of the TFT array substrate than the second pixel unit, and an angle of the V-shaped electrode in the first pixel unit is smaller than an angle of the V-shaped electrode in the second pixel unit.

The present disclosure provides a TFT array substrate, including: a plurality of pixel units; wherein each of the pixel units comprises a first electrode which comprises a first portion and a second portion, an angle is present between the first portion and the second portion, the plurality of pixel units comprise a first pixel unit and a second pixel unit, the first pixel unit is closer to an edge of the TFT array substrate than the second pixel unit, and an angle formed between the first portion and the second portion in the first pixel unit is smaller than an angle formed between the first portion and the second portion in the second pixel unit.

The present disclosure further provides a liquid crystal display panel, including the TFT array substrate described above.

The present disclosure further provides a liquid crystal display device, including: a plurality of pixel units; wherein each of the pixel units includes a first electrode which is a V-shaped electrode with an angle; the plurality of pixel units include a first pixel unit and a second pixel unit; and wherein, the first pixel unit is closer to an edge of the TFT array substrate than the second pixel unit, and an angle of the V-shaped electrode in the first pixel unit is smaller than an angle of the V-shaped electrode in the second pixel unit; the TFT array substrate further includes a third pixel unit, wherein, the third pixel unit is closer to an edge of the TFT array substrate than the second pixel unit, and the angle of the V-shaped electrode in the third pixel unit is equal to the angle of the V-shaped electrode in the first pixel unit; the TFT array substrate further includes a plurality of pixel units, angles of V-shaped electrodes in the plurality of pixel units are larger than the angle of the V-shaped electrode in the first pixel unit and are smaller than the angle of the V-shaped electrode in the second pixel unit, and wherein the angle of the V-shaped electrode in the first pixel unit, the angles of V-shaped electrodes in the plurality of pixel units, and the angle of the V-shaped electrode in the second pixel unit are sequentially increased; and the liquid crystal display device further includes a backlight module, wherein, a larger amount of light is emitted from a portion of the backlight module corresponding to the first electrode with a smaller angle in the liquid crystal display panel, and a smaller amount of light is emitted from a portion of the backlight module corresponding to the first electrode with a larger angle in the liquid crystal display panel.

With the TFT array substrate, the liquid crystal display panel and the liquid crystal display device described in the disclosure, the problem that the large sized display device presents an inferior display effect for a viewer observing the display device at a large visual angle is solved, thus improving the display effect.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be described in detail below with reference to the drawings to illustrate embodiments of the disclosure. It should be understood that various changes can be made on the basis of the description and the beneficial effects of the disclosure can still be achieved. Therefore, the description below should not be construed as limiting the disclosure.

In order to describe the features of the embodiments, commonly known functions and structures are not described in detail in the following description, because it would make the disclosure confusing due to unnecessary detail.

The disclosure is described by way of example with reference to the drawings in the following paragraphs. Points of the disclosure and features thereof will be made more clear according to the following description. It is noted that the drawings are drawn in a simple form and inexact ratio in order to assist in illustrating the embodiments of the disclosure.

Figure 1:
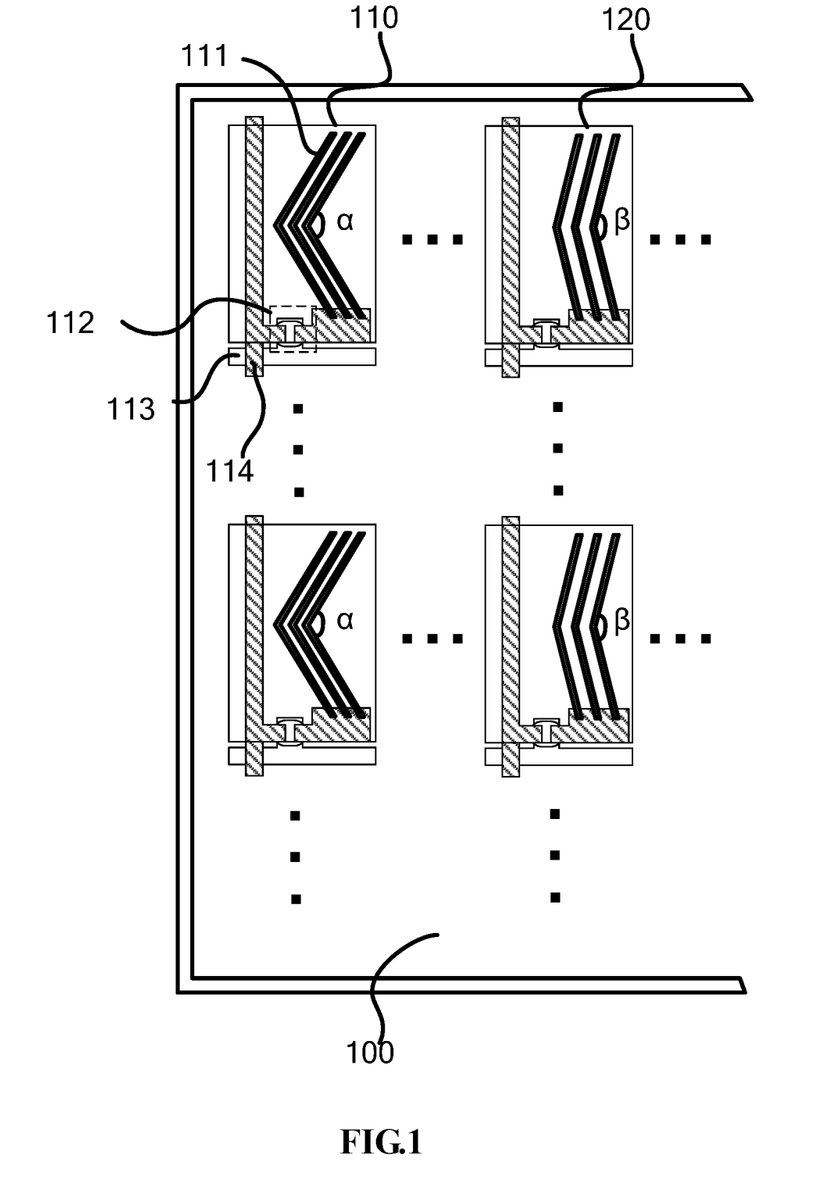
FIG. 1 is a schematic diagram showing a first TFT array substrate, according to embodiments of the disclosure.

Embodiments of the disclosure provide a TFT array substrate. As shown in FIG. 1, which is a schematic diagram showing a first TFT array substrate, according to embodiments of the disclosure, the TFT array substrate 100 includes a plurality of pixel units. Each of the pixel units includes a data line 114, a scan line 113 and a TFT switch 112, where, the scan line 113 is electrically connected with a gate electrode of the TFT switch 112, and the data line 114 is electrically connected with a source electrode of the TFT switch 112. The pixel unit further includes a first electrode 111, which is a V-shaped electrode with an angle. The plurality of pixel units in the TFT array substrate 100 include first pixel units 110 and second pixel units 120, where, the first pixel units 110 are closer to an edge of the TFT array substrate 100 than the second pixel units 120. In embodiments of FIG. 1, the edge of the TFT array substrate 100 is illustratively described as a left edge of the TFT array substrate 100. In other embodiments, the edge of the TFT array substrate 100 may also refer to any of edges of the TFT array substrate 100. An angle $\alpha$ of the V-shaped electrode in the first pixel unit 110 is smaller than an angle $\beta$ of the V-shaped electrode in the second pixel unit 120.

Figure 2:
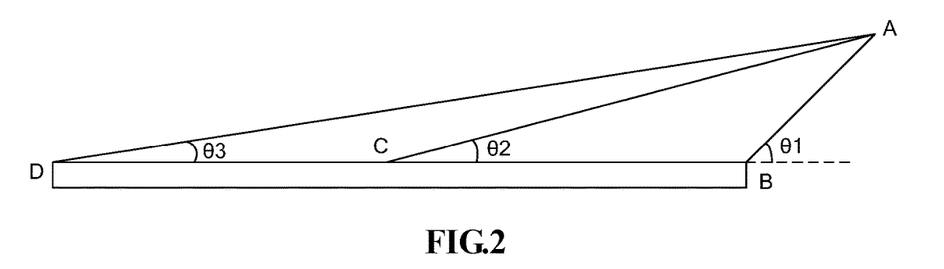
FIG. 2 is a schematic diagram showing a relationship between a viewpoint and a position of the display device, according to embodiments of the disclosure.

With the TFT array substrate 100 of FIG. 1, a large-sized display device can present an improved display effect for a viewer observing the display device from a large visual angle. Reference is now made to FIG. 2, which is a schematic diagram showing a relationship between a viewpoint and a position of the display device. When the display device is viewed from a viewpoint A, a viewing angle for a point B on the display device is represented by $\theta1$, a viewing angle for a point C on the display device is represented by $\theta2$, and a viewing angle for a point D on the display device is represented by $\theta3$, wherein, $\theta1>\theta2>\theta3$. When an image displayed at the point D on the display device is viewed from the viewpoint A, since the point D is located at the left side of the display panel and the first pixel unit having the V-shaped electrode with a small angle is disposed at the point D, the display device can present a good display effect at the point D viewed at the large visual angle, given that the smaller angle of the V-shaped electrode brings about the larger visual angle. Therefore, a display device equipped with the TFT array substrate 100 of FIG. 1 can eliminate the problem that the display device presents an inferior display effect for a viewer viewing the display device at a large visual angle, thus improving the display effect.

In the case that the pixel unit includes a plurality of first electrodes, the plurality of first electrodes have the same angle.

Figure 3:
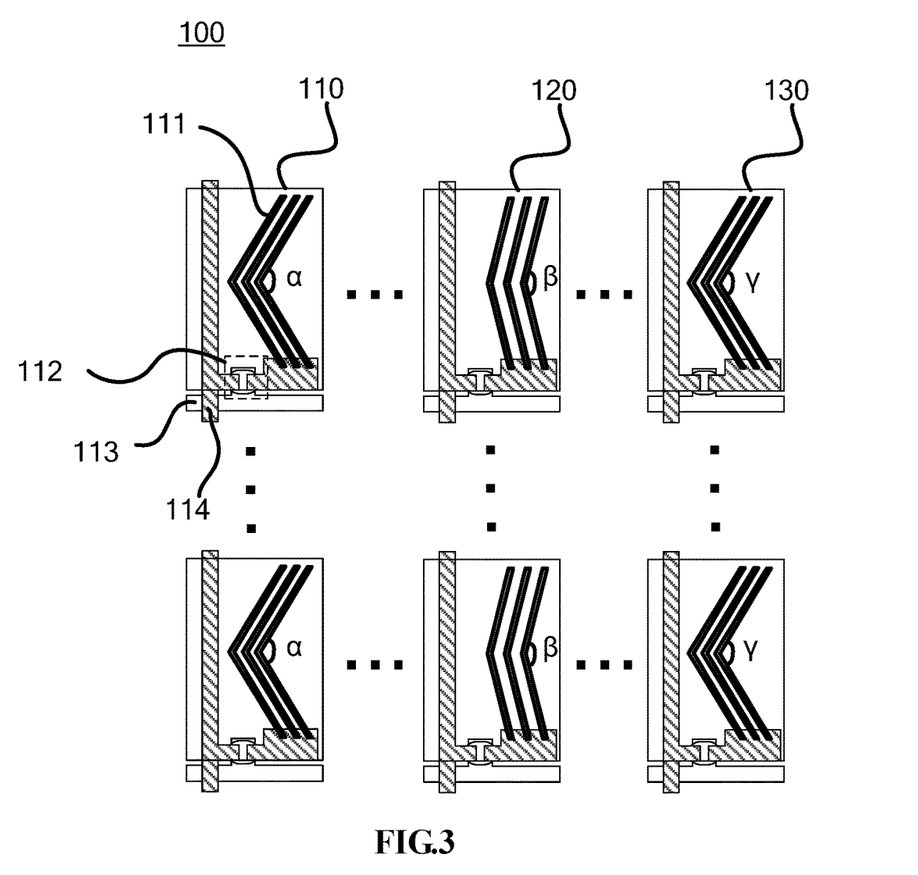
FIG. 3 is a schematic diagram showing a second TFT array substrate, according to embodiments of the disclosure.

FIG. 3 is a schematic diagram showing a second TFT array substrate, according to embodiments of the disclosure. As shown in FIG. 3, the TFT array substrate 100 includes a plurality of pixel units. Each of the pixel units includes a data line 114, a scan line 113 and a TFT switch 112, where, the scan line 113 is electrically connected with a gate electrode of the TFT switch 112, and the data line 114 is electrically connected with a source electrode of the TFT switch 112. The pixel unit further includes a first electrode 111, which is a V-shaped electrode with an angle. The plurality of pixel units in the TFT array substrate 100 include first pixel units 110, second pixel units 120 and third pixel units 130, where, the second pixel units 120 are located between the first pixel units 110 and the third pixel units 130. An angle $\gamma$ of the V-shaped electrode of the third pixel unit 130 is equal to an angle $\alpha$ of the V-shaped electrode of the first pixel unit 110, and the angle $\gamma$ of the V-shaped electrode of the third pixel unit 130 and the angle $\alpha$ of the V-shaped electrode of the first pixel unit 110 both are smaller than an angle $\beta$ of the V-shaped electrode of the second pixel unit 120. It is noted that the angle of the V-shaped electrode of the third pixel unit 130 is equal to the angle of the V-shaped electrode of the first pixel unit 110 in FIG. 3. However, in other embodiments, the angle of the V-shaped electrode in the third pixel unit 130 may be different from the angle of the V-shaped electrode in the first pixel unit 110, as long as the angle of the V-shaped electrode in the third pixel unit 130 is smaller than the angle of the V-shaped electrode in the second pixel unit 120. Since the second pixel unit 120 is located between the first pixel unit 110 and the third pixel unit 130, the display device can present an improved display effect for a viewer observing the display device from a large visual angle from the side of either the first pixel unit 110 or the third pixel unit 130.

Figure 4:
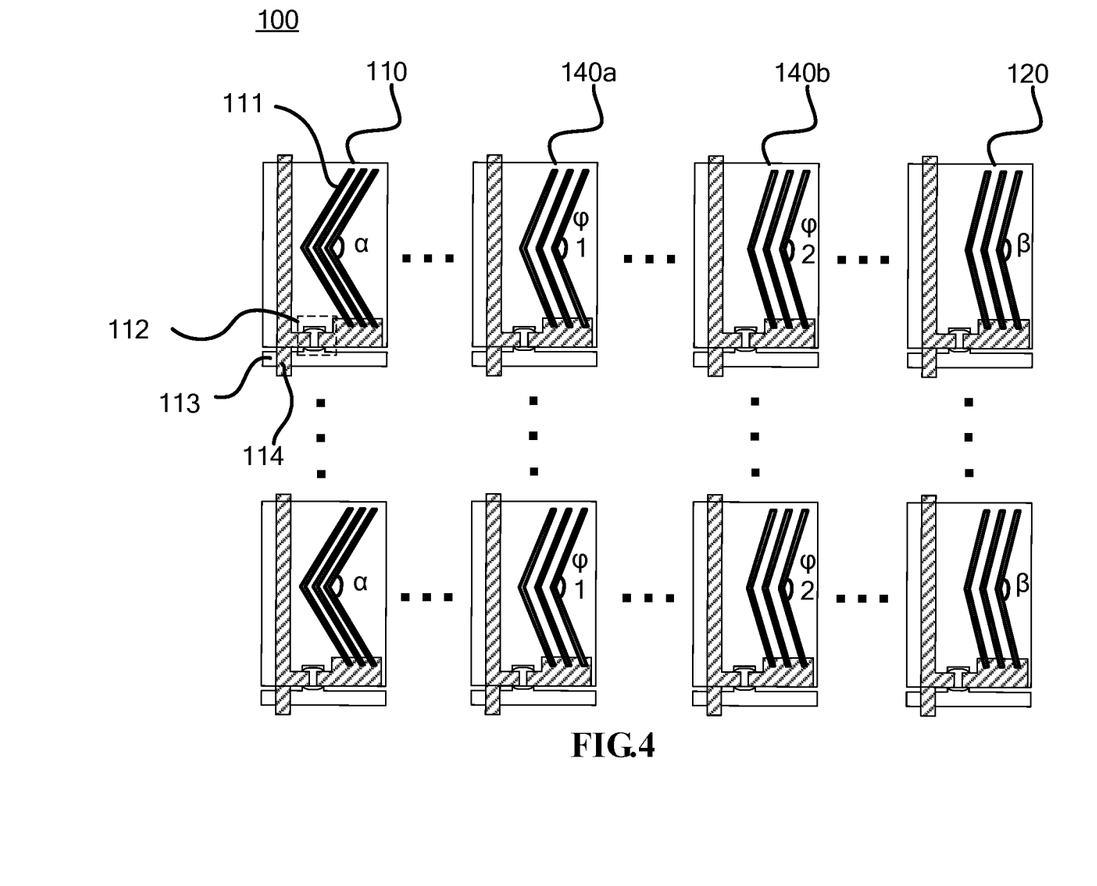
FIG. 4 is a schematic diagram showing a third TFT array substrate, according to embodiments of the disclosure.

FIG. 4 is a schematic diagram showing a third TFT array substrate, according to embodiments of the disclosure. As shown in FIG. 4, the TFT array substrate 100 includes a plurality of pixel units. The pixel unit includes a data line 114, a scan line 113 and a TFT switch 112, where, the scan line 113 is electrically connected with a gate electrode of the TFT switch 112, and the data line 114 is electrically connected with a source electrode of the TFT switch 112. The pixel unit further includes a first electrode 111, which is a V-shaped electrode with an angle. The plurality of pixel units in the TFT array substrate 100 include first pixel units 110 and second pixel units 120, where, the first pixel units 110 are closer to an edge of the TFT array substrate 100 than the second pixel units 120. In embodiments of FIG. 4, the edge of the TFT array substrate 100 refers to the left edge of the TFT array substrate 100. In other embodiments, the edge of the TFT array substrate 100 may refer to any edge of the TFT array substrate 100. An angle α of the V-shaped electrode of the first pixel unit 110 is smaller than an angle β of the V-shaped electrode of the second pixel unit 120. The TFT array substrate 100 further includes a plurality of pixel units, such as pixel units 140a and pixel units 140b, disposed between the first pixel units 110 and the second pixel units 120. The angle α of the V-shaped electrode in the first pixel unit 110, an angle φ1 of the V-shaped electrode in the pixel unit 140a, an angle φ2 of the V-shaped electrode in the pixel unit 140b, and the angle β of the V-shaped electrode in the second pixel unit 120 are increased in sequence, i.e. α<φ1<φ2<β. It is noted that in FIG. 4, illustratively, the pixel units 140a and 140b are disposed between the first pixel units 110 and the second pixel units 120. However, embodiments are not limited to the case that only the pixel units 140a and 140b are disposed between the first pixel units 110 and the second pixel units 120. As such, in embodiments, a plurality of pixel units are disposed between the first pixel units 110 and the second pixel units 120, and angles of the V-shaped electrodes of the first pixel unit 110, the pixel units between the first pixel unit 110 and the second pixel unit 120, and the second pixel unit 120 are sequentially varied, so that the display device can present a viewed effect that is gradually transitional, thereby better improving the display effect.

Figure 5:
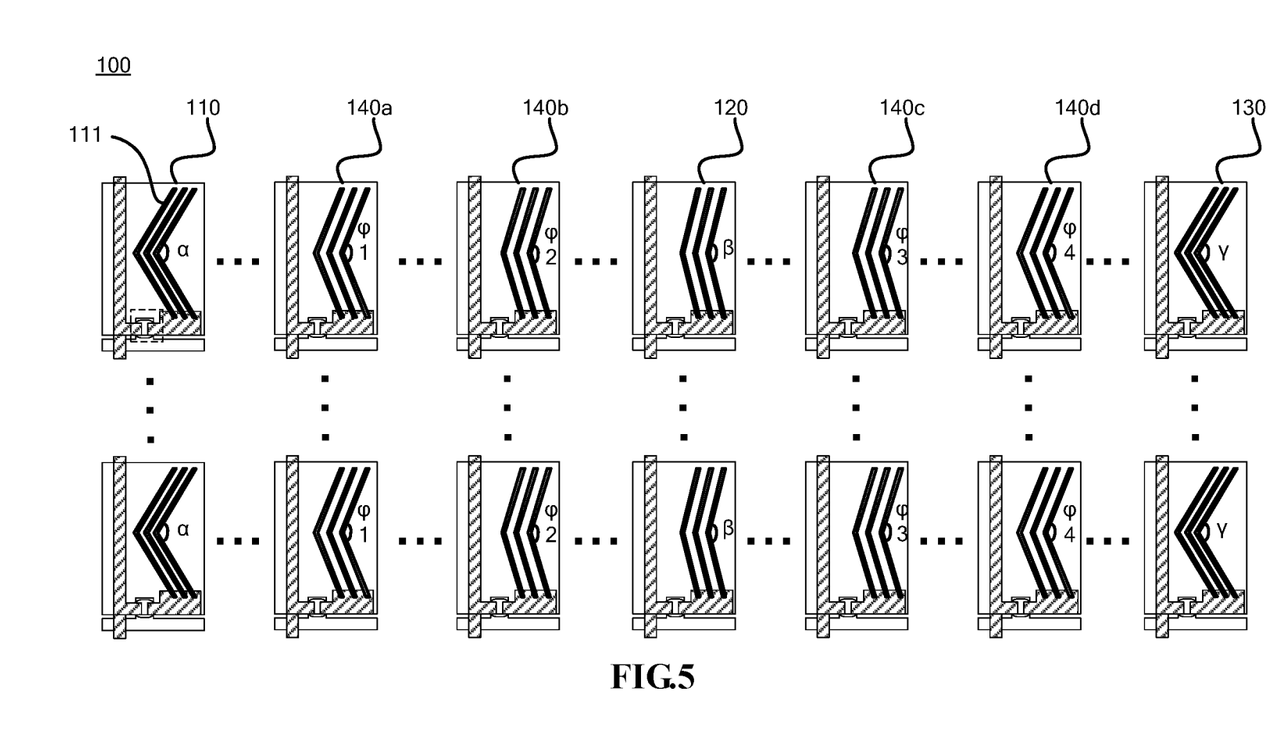
FIG. 5 is a schematic diagram showing a fourth TFT array substrate, according to embodiments of the disclosure.

FIG. 5 is a schematic diagram showing a fourth TFT array substrate, according to embodiments of the disclosure. As shown in FIG. 5, the TFT array substrate 100 further includes third pixel units 130, and the second pixel units 120 are located between the first pixel units 110 and the third pixel units 130, and an angle γ of the V-shaped electrode in the third pixel unit 130 is equal to an angle α of the V-shaped electrode in the first pixel unit 110. The TFT array substrate 100 further includes a plurality of pixel units, such as pixel units 140c and pixel units 140d, disposed between the second pixel units 120 and the third pixel units 130. The angle β of the V-shaped electrode in the second pixel unit 120, an angle φ3 of the V-shaped electrode in the pixel unit 140c, an angle φ4 of the V-shaped electrode in the pixel unit 140d, and the angle γ of the V-shaped electrode of the third pixel unit 130 are sequentially decreased, i.e. β>φ3>φ4>γ, so that in the TFT array substrate, the relationship of the angles of the plurality of pixel units is α<φ1<φ2<β>φ3>φ4>γ. It is noted that the angle of the V-shaped electrode of the third pixel unit 130 is equal to the angle of the V-shaped electrode of the first pixel unit 110 in FIG. 5. However, in other embodiments, the angle of the V-shaped electrode in the third pixel unit 130 may be different from the angle of the V-shaped electrode in the first pixel unit 110, as long as the angle of the V-shaped electrode in the third pixel unit 130 is smaller than the angle of the V-shaped electrode of the second pixel unit 120.

Figure 6:
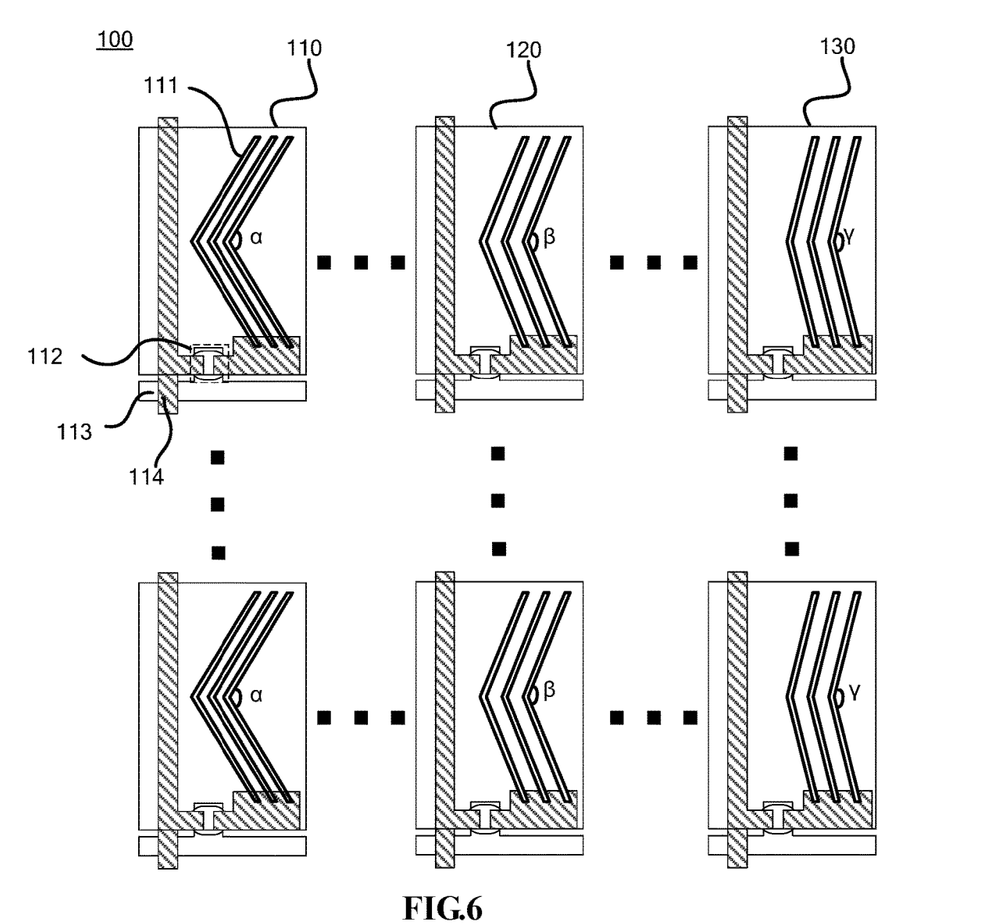
FIG. 6 is a schematic diagram showing a fifth TFT array substrate, according to embodiments of the disclosure.

FIG. 6 is a schematic diagram showing a fifth TFT array substrate, according to embodiments of the disclosure. As shown in FIG. 6, the TFT array substrate includes a plurality of pixel units. The pixel unit includes a data line 114, a scan line 113 and a TFT switch 112, where, the scan line 113 is electrically connected with a gate electrode of the TFT switch 112, and the data line 114 is electrically connected with a source electrode of the TFT switch 112. The pixel unit further includes a first electrode 111, which is a V-shaped electrode with an angle. The plurality of pixel units in the TFT array substrate 100 include first pixel units 110, second pixel units 120 and third pixel units 130, and the second pixel units 120 are located between the first pixel units 110 and the third pixel units 130. An angle α of the V-shaped electrode in the first pixel unit 110 is smaller than an angle β of the V-shaped electrode in the second pixel unit 120, and an angle γ of the V-shaped electrode in the third pixel unit 130 is larger than the angle β of the V-shaped electrode in the second pixel unit 120, i.e. α<β<γ.

Figure 7:
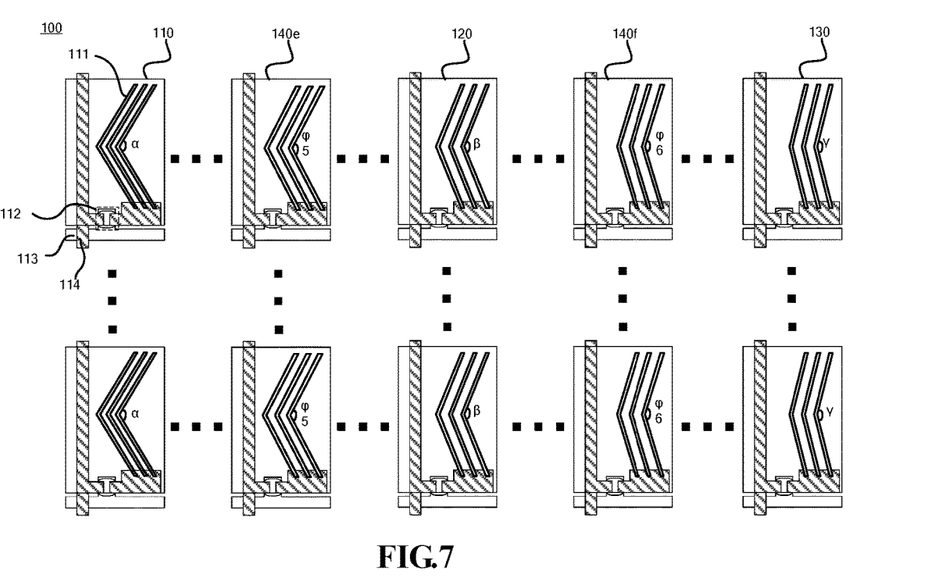
FIG. 7 is a schematic diagram showing a sixth TFT array substrate, according to embodiments of the disclosure.

FIG. 7 is a schematic diagram showing a sixth TFT array substrate, according to embodiments of the disclosure. As shown in FIG. 7, the TFT array substrate 100 includes a plurality of pixel units. The pixel unit includes a data line 114, a scan line 113 and a TFT switch 112, where, the scan line 113 is electrically connected with a gate electrode of the TFT switch 112, and the data line 114 is electrically connected with a source electrode of the TFT switch 112. The pixel unit further includes a first electrode 111, which is a V-shaped electrode with an angle. The plurality of pixel units in the TFT array substrate 100 include first pixel units 110 and second pixel units 120, where, an angle α of the V-shaped electrode of the first pixel unit 110 is smaller than an angle β of the V-shaped electrode of the second pixel unit 120. The plurality of pixel units of the TFT array substrate 100 further include third pixel units 130, where, the second pixel units 120 are located between the first pixel units 110 and the third pixel units 130, and an angle γ of the V-shaped electrode of the third pixel unit 130 is larger than the angle β of the V-shaped electrode of the second pixel unit 120. The TFT array substrate 100 further includes a plurality of pixel units, such as pixel units 140e, disposed between the first pixel units 110 and the second pixel units 120, and further includes a plurality of pixel units, such as pixel units 140f, disposed between the second pixel units 120 and the third pixel units 130. The angle α of the V-shaped electrode in the first pixel unit 110, an angle φ5 of the V-shaped electrode in the pixel unit 140e, the angle β of the V-shaped electrode in the second pixel unit 120, an angle φ6 of the V-shaped electrode in the pixel unit 140f, and the angle γ of the V-shaped electrode in the third pixel unit 130 are sequentially increased, i.e. α<φ5<β<φ6<γ. Illustratively in embodiments, the pixel unit 140e is disposed between the first pixel unit 110 and the second pixel unit 120 and the pixel unit 140f is disposed between the second pixel unit 120 and the third pixel unit 130, however the embodiments are not limited to the case that only the pixel unit 140e is disposed between the first pixel unit 110 and the second pixel unit 120 and only the pixel unit 140f is disposed between the second pixel unit 120 and the third pixel unit 130.

Figure 8:
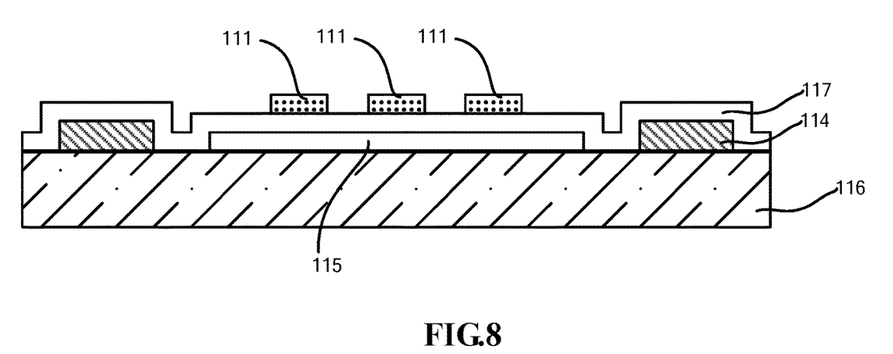
FIG. 8 is a sectional diagram showing a pixel unit, according to embodiments of the disclosure.

FIG. 8 is a sectional diagram showing a pixel unit, according to embodiments of the disclosure. As shown in FIG. 8, the TFT array substrate includes a glass substrate 116 and a data line 114, and the data line 114 is disposed on the glass substrate 116. The TFT array substrate further includes a second electrode 115, which is a planar electrode and disposed on the glass substrate 116. A first electrode 111 is disposed on the second electrode 115, and the first electrode 111 and the second electrode 115 are located at different layers. An insulation layer 117 is disposed between the first electrode 111 and the second electrode 115. The first electrode 111 is a pixel electrode and the second electrode 115 is a common electrode; or the first electrode 111 is a common electrode and the second electrode 115 is a pixel electrode.

Figure 9:
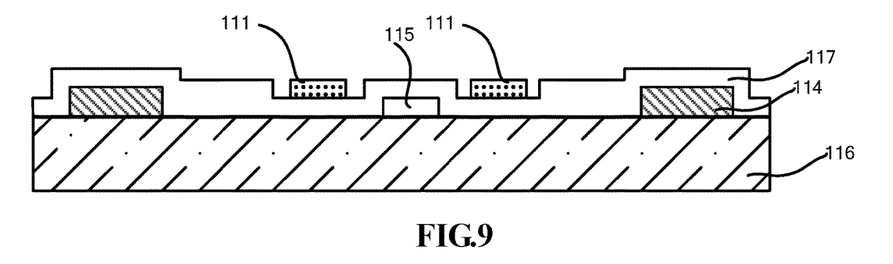
FIG. 9 is a sectional diagram showing another pixel unit, according to embodiments of the disclosure.

FIG. 9 is a sectional diagram showing another pixel unit, according to embodiments of the disclosure. As shown in FIG. 9, the TFT array substrate includes a glass substrate 116 and a data line 114, and the data line 114 is disposed on the glass substrate 116. The TFT array substrate further includes a second electrode 115, where, the second electrode 115 is a strip electrode with an angle, and is disposed on the glass substrate 116. A first electrode 111 is also disposed on the second electrode 115, and the first electrode 111 and the second electrode 115 are located at different layers. An insulation layer 117 is disposed between the first electrode 111 and the second electrode 115, where, the angle of the second electrode 115 is equal to the angle of the first electrode 111. The first electrode 111 is a pixel electrode and the second electrode 115 is a common electrode; or the first electrode 111 is a common electrode and the second electrode 115 is a pixel electrode.

Figure 10:
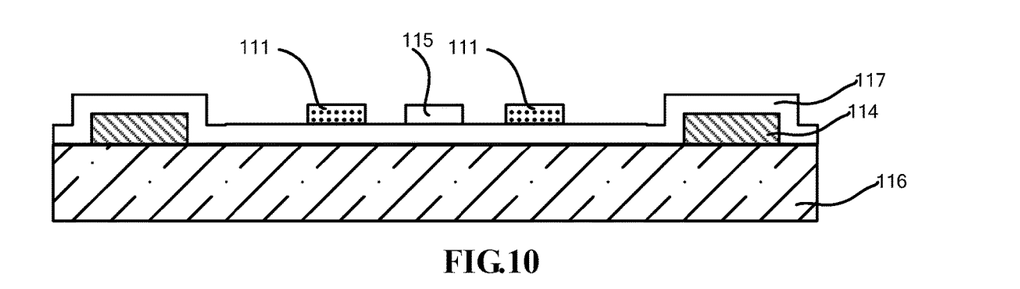
FIG. 10 is a sectional diagram showing a further pixel unit, according to embodiments of the disclosure.

FIG. 10 is a sectional diagram showing a further pixel unit, according to embodiments of the disclosure. As shown in FIG. 10, the TFT array substrate includes a glass substrate 116 and a data line 114, and the data line 114 is disposed on the glass substrate 116. The TFT array substrate further includes a second electrode 115, where, the second electrode 115 is a strip electrode with an angle and is disposed on the glass substrate 116. A first electrode 111 is also disposed on the glass substrate 116, and the first electrode 111 and the second electrode 115 are located at the same layer. An insulation layer 117 is disposed between the first electrode 111 and the glass substrate 116 and between the second electrode 115 and the glass substrate 116, where, the angle of the second electrode 115 is equal to the angle of the first electrode 111. The first electrode 111 is a pixel electrode and the second electrode 115 is a common electrode; or the first electrode 111 is a common electrode and the second electrode 115 is a pixel electrode.

Figure 11:
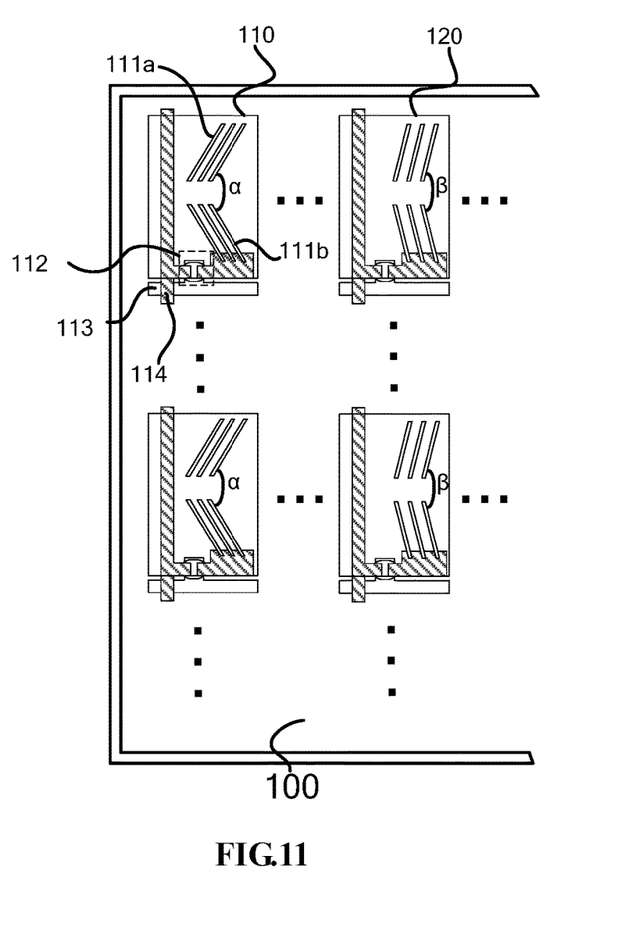
FIG. 11 is a schematic diagram showing a seventh TFT array substrate, according to embodiments of the disclosure.

Embodiments of the disclosure further provide a TFT array substrate as shown in FIG. 11. FIG. 11 is a schematic diagram showing a seventh TFT array substrate, according to embodiments of the disclosure. The TFT array substrate 100 includes a plurality of pixel units. The pixel unit includes a data line 114, a scan line 113 and a TFT switch 112, where, the scan line 113 is electrically connected with a gate electrode of the TFT switch 112, and the data line 114 is electrically connected with a source electrode of the TFT switch 112. The pixel unit further includes a first electrode which includes a first portion 111a and a second portion 111b, where, an angle is present between the first portion 111a and the second portion 111b. The plurality of pixel units of the TFT array substrate 100 include first pixel units 110 and second pixel units 120, where, the first pixel units 110 are closer to an edge of the TFT array substrate 100 than the second pixel units 120. In embodiments of FIG. 11, the edge of the TFT array substrate 100 refers to the left edge of the TFT array substrate 100. In other embodiments, the edge of the TFT array substrate 100 may refer to any edge of the TFT array substrate 100. An angle α formed between the first portion 111a and the second portion 111b of the first pixel unit 110 is smaller than an angle β formed between the first portion 111a and the second portion 111b of the second pixel unit 120.

Figure 12:
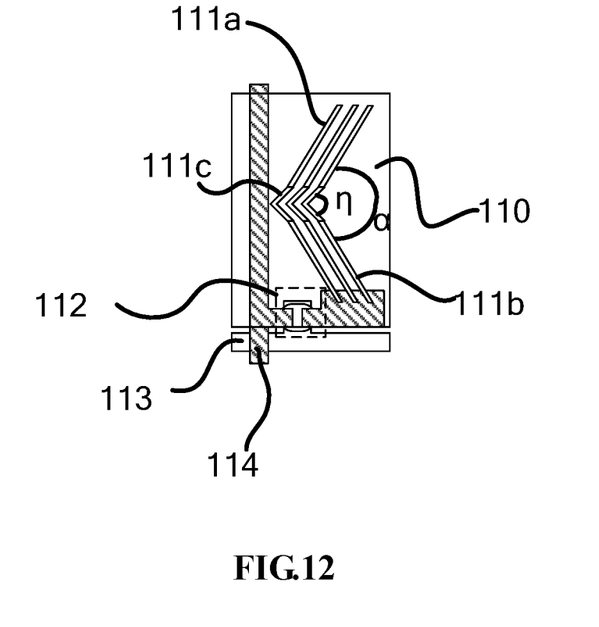
FIG. 12 is a schematic diagram showing a pixel unit, according to embodiments of the disclosure.

FIG. 12 is a schematic diagram showing a pixel unit, according to embodiments of the disclosure. As shown in FIG. 12, the pixel unit includes a data line 114, a scan line 113 and a TFT switch 112, where, the scan line 113 is electrically connected with a gate electrode of the TFT switch 112, and the data line 114 is electrically connected with a source electrode of the TFT switch 112. The pixel unit further includes a first electrode which includes a first portion 111a and a second portion 111b, where, an angle α is present between the first portion 111a and the second portion 111b. The first electrode further includes a connection portion 111c for connecting the first portion 111a with the second portion 111b, and the connection portion 111c has a V shape. An angle η of the V shape is smaller than the angle α formed between the first portion 111a and the second portion 111b.

Figure 13:
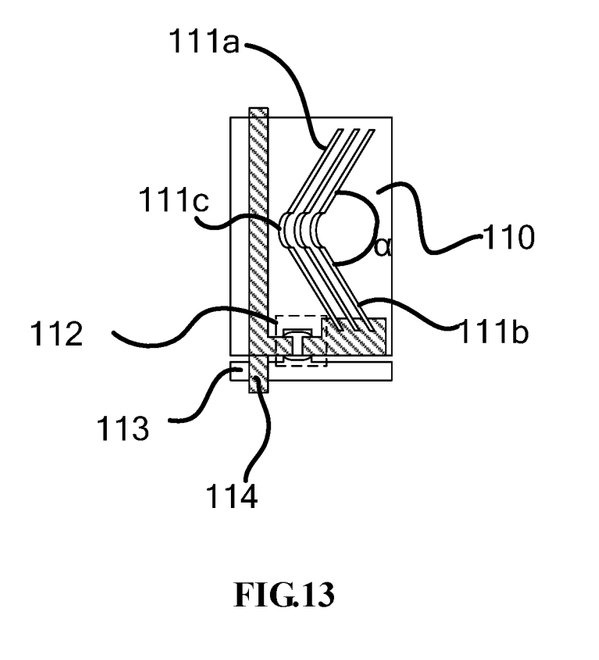
FIG. 13 is a schematic diagram showing another pixel unit, according to embodiments of the disclosure.

FIG. 13 is a schematic diagram showing another pixel unit, according to embodiments of the disclosure. As shown in FIG. 13, the pixel unit includes a data line 114, a scan line 113 and a TFT switch 112, where, the scan line 113 is electrically connected with a gate electrode of the TFT switch 112, and the data line 114 is electrically connected with a source electrode of the TFT switch 112. The pixel unit further includes a first electrode, which includes a first portion 111a and a second portion 111b, where, the first portion 111a and the second portion 111b both have an angle α. The first electrode further includes a connection portion 111c for connecting the first portion 111a with the second portion 111b, and the connection portion 111c is arc-shaped.

Embodiments of the disclosure further provide a liquid crystal display panel including the TFT array substrate described above.

With the TFT array substrate and the liquid crystal display panel, according to embodiments of the disclosure, the problem that the large sized display device presents an inferior display effect for a viewer observing the display device from a large visual angle can be solved, thus improving the display effect.

Figure 14:
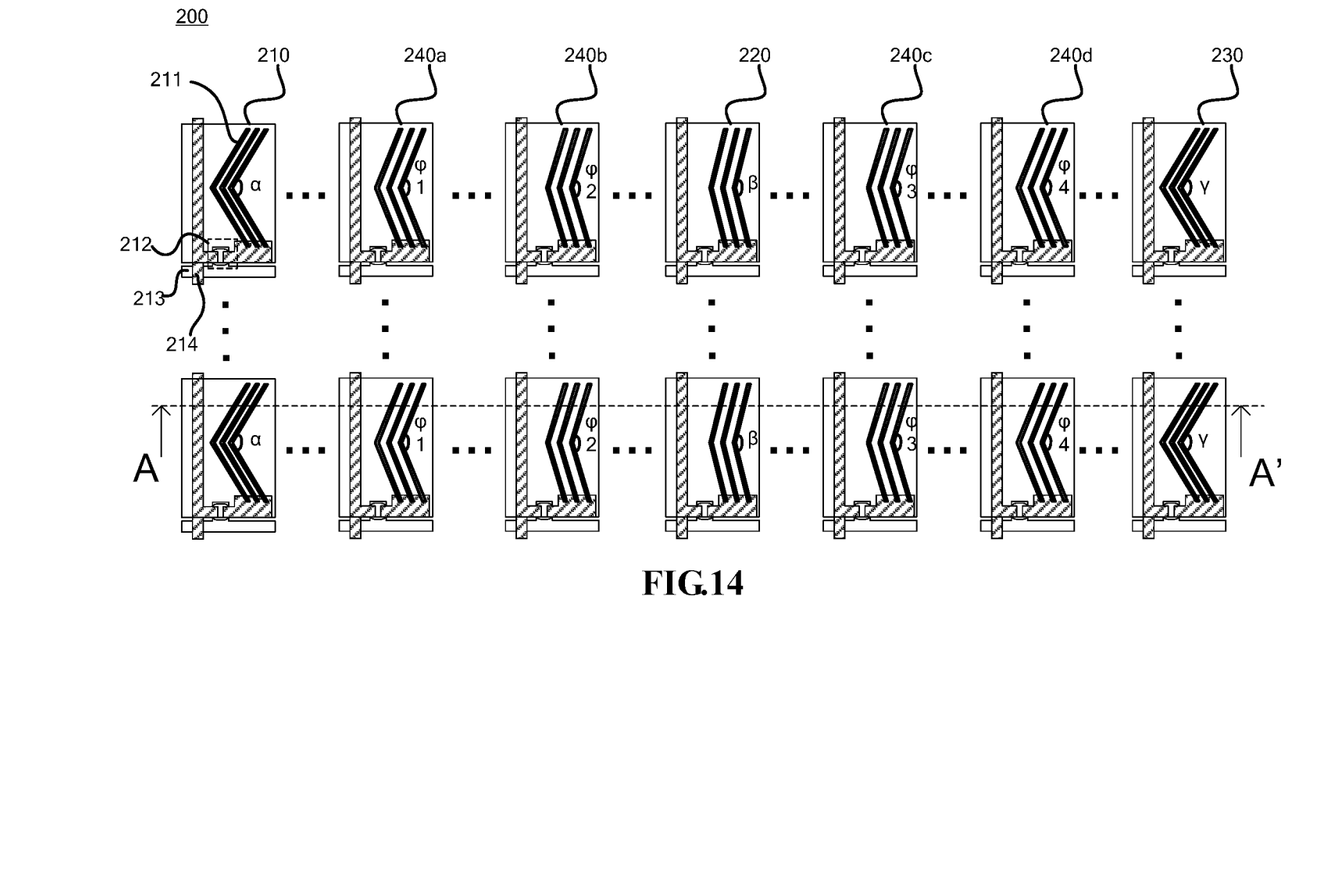
FIG. 14 is a schematic top view showing a liquid crystal display device, according to embodiments of the disclosure.

Embodiments of the disclosure provide a liquid crystal display device, as shown in FIG. 14. FIG. 14 is a schematic top view showing a liquid crystal display device, according to embodiments of the disclosure. The liquid crystal display device 200 includes a plurality of pixel units. The pixel unit includes a data line 214, a scan line 213, and a TFT switch 212, where, the scan line 213 is electrically connected with a gate electrode of the TFT switch 212, and the data line 214 is electrically connected with a source electrode of the TFT switch 212. The pixel unit further includes a first electrode 211, which is a V-shaped electrode with an angle. The plurality of pixel units in the TFT array substrate 200 include first pixel units 210 and second pixel units 220, where, an angle α of the V-shaped electrode in the first pixel unit 210 is smaller than an angle β of the V-shaped electrode in the second pixel unit 220. The liquid crystal display device 200 further includes third pixel units 230, where, the second pixel units 220 are located between the first pixel units 210 and the third pixel units 230, and an angle γ of the V-shaped electrode in the third pixel unit 230 is equal to an angle α of the V-shaped electrode in the first pixel unit 210. The TFT array substrate 200 further includes a plurality of pixel units, such as pixel units 240a, pixel units 240b, pixel units 240c, and pixel units 240d, disposed between the first pixel units 210 and the third pixel units 230. The angle α of the V-shaped electrode in the first pixel unit 210, an angle φ1 of the V-shaped electrode in the pixel unit 240a disposed between the first pixel unit 210 and the second pixel unit 220, an angle φ2 of the V-shaped electrode in the pixel unit 240b disposed between the first pixel unit 210 and the second pixel unit 220, and the angle β of the V-shaped electrode in the second pixel unit 220 are sequentially increased, i.e. α<φ1<φ2<β. The angle β of the V-shaped electrode in the second pixel unit 220, an angle φ3 of the V-shaped electrode in the pixel unit 240c disposed between the second pixel unit 220 and the third pixel unit 230, an angle φ4 of the V-shaped electrode in the pixel unit 240d disposed between the second pixel unit 220 and the third pixel unit 230, and the angle γ of the V-shaped electrode in the third pixel unit 230 are sequentially decreased, i.e.

$\beta>\varphi3>\varphi4>\gamma$, so that in the TFT array substrate, the relationship of the angles of the plurality of pixel units is $\alpha<\varphi1<\varphi2<\beta>\varphi3>\varphi4>\gamma$.

Figure 15:
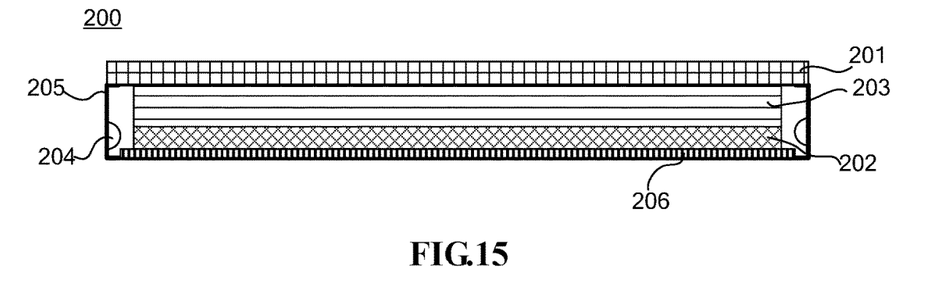
FIG. 15 is a sectional diagram of the TFT array substrate shown in FIG. 14 taken along a sectional line A-A'.

The liquid crystal display device 200 further includes a backlight module, where, a larger amount of light is emitted from a portion of the backlight module corresponding to the first electrode with a smaller angle in the liquid crystal display panel, and a smaller amount of light is emitted from a portion of the backlight module corresponding to the first electrode with a larger angle in the liquid crystal display panel. FIG. 15 is a sectional diagram of the TFT array substrate shown in FIG. 14 taken along a sectional line A-A'. As shown in FIG. 15, the backlight module in the liquid crystal display device 200 is located below the liquid crystal display panel 201, and includes a frame 205 and a light reflection layer 206 located within the frame 205. A light guide plate 202 is disposed above the light reflection layer. A photic film layer 203 is disposed above the light guide plate 202. The backlight module further includes light sources 204 located internally at two opposite sides of the frame 205.

With the liquid crystal display device 200, according to embodiments of the disclosure, the problem that the large sized display device presents an inferior display effect for a viewer observing the display device a large visual angle can be solved, thus improving the display effect. Since light is faded in the light guide plate, the amount of light illuminating the liquid crystal display panel from either of the two sides of the liquid crystal display device 200 is larger than that of lights illuminating the liquid crystal display panel from the center of the liquid crystal display device 200, which can compensate for differences of light transmission amounts due to differences between the angles of the V-shaped electrodes of the plurality of pixel electrodes.

Figure 16:
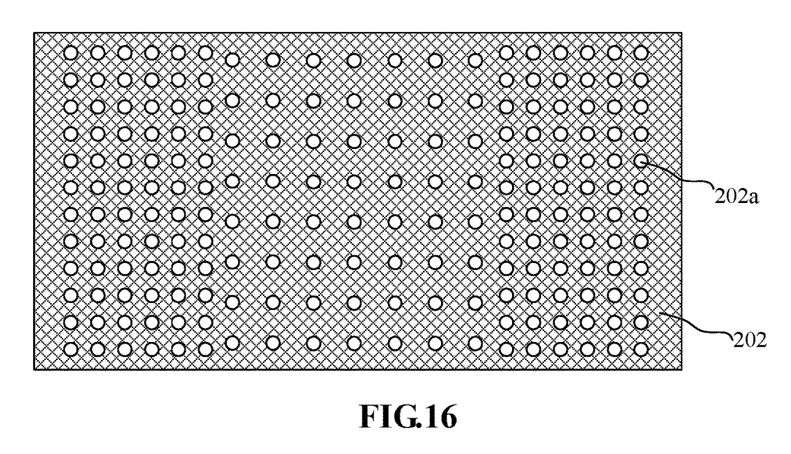
FIG. 16 is a schematic diagram showing the structure of a light guide plate, according to embodiments of the disclosure.

FIG. 16 is a schematic diagram showing the structure of a light guide plate, according to embodiments of the disclosure. As shown in FIG. 16, a plurality of light guide spots 202a are disposed on the light guide plate 202 provided within the backlight module, where, density of the light guide spots 202a at a position of the light guide plate 202 corresponding to the first electrode with a smaller angle in the liquid crystal display panel 201 (i.e. corresponding to the first pixel unit and the third pixel unit) is larger than that of the light guide spots 202a at a position of the light guide plate 202 corresponding to the first electrode with a larger angle in the liquid crystal display panel 201 (i.e., corresponding to the second pixel unit).

From the above, the disclosure is described in reference to various embodiments, which are not intended to limit the disclosure. Various changes and variants can be made without departing from the spirit and the scope of protection of the disclosure. Therefore, if these changes and variants of the disclosure fall within the appended claims of the disclosure and equivalents thereof, the disclosure is intended to contain these changes and variants.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. A TFT array substrate, comprising:
a plurality of pixel units;
wherein each of the plurality of pixel units comprises a first electrode which comprises a first portion and a second portion, an angle is present between an extension portion of the first portion and an extension portion of the second portion, the plurality of pixel units comprise a first pixel unit and a second pixel unit, the first pixel unit is closer to an edge of the TFT array substrate than the second pixel unit, and an angle formed between an extension portion of the first portion and an extension portion of the second portion in the first pixel unit is smaller than an angle formed between an extension portion of the first portion and an extension portion of the second portion in the second pixel unit;
wherein the first electrode comprises a connection portion for connecting the first portion with the second portion; and
wherein one of:
the connection portion has a V shape, and an angle of the V shape of the connection portion is smaller than the angle formed between the extension portion of the first portion and the extension portion of the second portion; and
the connection portion is arc-shaped.

2. The TFT array substrate of claim 1, wherein, the TFT array substrate further comprising a third pixel unit; wherein the second pixel unit is located between the first pixel unit and the third pixel unit; and an angle formed between an extension portion of the first portion and an extension portion of the second portion in the third pixel unit is equal to the angle formed between the extension portion of the first portion and the extension portion of the second portion in the first pixel unit, or an angle formed between an extension portion of the first portion and an extension portion of the second portion in the third pixel unit is larger than the angle formed between the extension portion of the first portion and the extension portion of the second portion in the second pixel unit.

3. The TFT array substrate of claim 2, the TFT array substrate further comprising a plurality of pixel units disposed between the first pixel unit and the second pixel unit, wherein, the angle formed between the extension portion of the first portion and the extension portion of the second portion in the first pixel unit, angles formed between an extension portion of the first portion and an extension portion of the second portion in the plurality of pixel units disposed between the first pixel unit and the second pixel unit, and the angle formed between the extension portion of the first portion and the extension portion of the second portion in the second pixel unit are sequentially increased.

4. The TFT array substrate of claim 3, further comprising a plurality of pixel units disposed between the second pixel unit and the third pixel unit, wherein, the angle formed between the extension portion of the first portion and the extension portion of the second portion in the second pixel unit, angles formed between an extension portion of the first portion and an extension portion of the second portion in the plurality of pixel units disposed between the second pixel unit and the third pixel unit, and the angle formed between the extension portion of the first portion and the extension portion of the second portion in the third pixel unit are sequentially decreased.

5. The TFT array substrate of claim 1, wherein, the first electrodes in the same pixel unit have the same angle.

6. The TFT array substrate of claim 1, further comprising a second electrode, wherein, the first electrode and the second electrode are located at different layers, and the second electrode is a planar electrode.

7. The TFT array substrate of claim 1, further comprising a second electrode which is a strip electrode with an angle, wherein, the angle of the second electrode is equal to the angle of the first electrode in the same pixel unit.

8. The TFT array substrate of claim 7, wherein, the second electrode and the first electrode are located at the same layer; or the second electrode and the first electrode are located at different layers.

9. The TFT array substrate of claim 1, further comprising a second electrode, wherein, the first electrode is a pixel electrode and the second electrode is a common electrode; or the first electrode is a common electrode and the second electrode is a pixel electrode.

10. A liquid crystal display device, comprising a TFT array substrate, wherein the TFT array substrate comprises:
a plurality of pixel units;
wherein each of the plurality of pixel units comprises a first electrode which comprises a first portion and a second portion, an angle is present between an extension portion of the first portion and an extension portion of the second portion, the plurality of pixel units comprise a first pixel unit and a second pixel unit, the first pixel unit is closer to an edge of the TFT array substrate than the second pixel unit, and an angle formed between an extension portion of the first portion and an extension portion of the second portion in the first pixel unit is smaller than an angle formed between an extension portion of the first portion and an extension portion of the second portion in the second pixel unit;

wherein the first electrode comprises a connection portion for connecting the first portion with the second portion; and wherein one of:

the connection portion has a V shape, and an angle of the V shape of the connection portion is smaller than the angle formed between the extension portion of the first portion and the extension portion of the second portion; and the connection portion is arc-shaped.

* * * * *